United States Patent
Balakrishna et al.

[11] Patent Number: 6,056,820
[45] Date of Patent: May 2, 2000

[54] ADVANCED PHYSICAL VAPOR TRANSPORT METHOD AND APPARATUS FOR GROWING HIGH PURITY SINGLE CRYSTAL SILICON CARBIDE

[75] Inventors: Vijay Balakrishna, Monroeville; Godfrey Augustine, Pittsburgh; Walter E. Gaida, East Pittsburgh; R. Noel Thomas, Murrysville; Richard H. Hopkins, Export, all of Pa.

[73] Assignee: Northrop Grumman Corporation, Los Angeles, Calif.

[21] Appl. No.: 09/112,427

[22] Filed: Jul. 10, 1998

[51] Int. Cl.⁷ .............................. C30B 35/00; C30B 23/00
[52] U.S. Cl. .............................. 117/200; 117/84; 117/88; 117/951
[58] Field of Search .............................. 117/200, 84, 88, 117/951

[56] References Cited

U.S. PATENT DOCUMENTS

| Re. 34,861 | 2/1995 | Davis et al. | 437/100 |
| 5,895,526 | 4/1999 | Kitoh et al. | 117/84 |
| 5,964,944 | 10/1999 | Sugiyama et al. | 117/107 |
| 5,985,024 | 11/1999 | Balakrishna et al. | 117/84 |

FOREIGN PATENT DOCUMENTS

| 406128094 | 5/1994 | Japan . |
| 409048688 | 2/1997 | Japan . |
| 409268099 | 10/1997 | Japan . |

OTHER PUBLICATIONS

R.W. Brander "Epitaxial Growth of Silicon Carbide" Jul. 1964 pp. 881–883 J. Electrochemical Soc.

*Primary Examiner*—William Powell
*Assistant Examiner*—Donald L. Champagne

[57] ABSTRACT

Pure silicon feedstock is melted and vaporized in a physical vapor transport furnace. In one embodiment the vaporized silicon 46 is reacted with a high purity carbon member 74, such as a porous carbon disc, disposed directly above the silicon. The gaseous species resulting from the reaction are deposited on a silicon carbide seed crystal 50 axially located above the disc, resulting in the growth of monocrystalline silicon carbide 56. In another embodiment, one or more gases, which may include a carbon-containing gas, are additionally introduced at 84 into the furnace, such as into a reaction zone above the disc, to participate in the growth process.

10 Claims, 5 Drawing Sheets

ADVANCED PHYSICAL VAPOR TRANSPORT METHOD AND APPARATUS FOR GROWING HIGH PURITY SINGLE CRYSTAL SILICON CARBIDE

BACKGROUND OF THE INVENTION

1. Field of the Invention

The invention in general relates to the growing of large silicon carbide crystals and more particularly to silicon carbide boules of high purity and high crystal quality for use in semiconductor devices.

2. Description of Related Art

Silicon carbide is being used extensively as a semiconductor material for various electronic applications. Semiconductor devices of silicon carbide have the ability to operate at higher voltages and temperatures than conventional silicon or gallium arsenide devices thus providing for higher power devices with reduced cooling requirements. Electronic applications for silicon carbide semiconductor devices include compact, low cost airborne, ship and ground-based solid state radars, including transmitters and power supplies, aircraft engine and flight controls, electric tank and ship propulsion systems, temperature tolerant power conditioners for aircraft and military vehicles and satellite communications, to name a few. In the commercial sector, silicon carbide may be used in the field of high definition television, industrial power conditioning, personal communication systems, nuclear control and instrumentation and electric vehicle power trains.

In one well-known process, known as physical vapor transport, a seed crystal of silicon carbide is positioned within a furnace system which also includes a source, or feedstock, in the form of silicon carbide powder. The feedstock is heated to a particular temperature, with the seed crystal maintained at a different temperature whereby the silicon carbide sublimes and silicon carbide is deposited upon the seed crystal forming a boule. After the boule is grown to the desired size, it is removed from the furnace system and then prepared and sliced into wafers for use as semiconductor device substrates.

In one type of arrangement, during the growth process, the feedstock becomes depleted and the apparatus may be partially disassembled in order to replenish the silicon carbide powder. This time consuming procedure is repeated until the desired silicon carbide crystal boule length is achieved. The present invention obviates this time consuming operation.

In addition, silicon carbide powder feedstock is not available in an ultra high purity, semiconductor quality grade. Consequently, the grown single crystal silicon carbide typically includes unwanted contaminants, leading to degraded operation. The present invention additionally provides for ultra high purity, semiconductor grade silicon carbide single crystal boule growth.

SUMMARY OF THE INVENTION

High purity silicon is melted and vaporized in a physical vapor transport growth furnace into which is placed a seed crystal such as silicon carbide. A high purity carbon member, such as a porous carbon disc, is disposed between the silicon and seed crystal to react with the vaporized silicon. A certain temperature distribution profile is maintained to promote deposition, on the seed crystal, of silicon carbide formed from the gaseous species resulting from the reaction of the silicon vapor and the carbon disc. In an alternative embodiment, a barrier member, which may be of a carbon-containing material is used along with a gas such as a carbon-containing gas introduced into the growth furnace, whereby silicon vapor passing through the barrier member additionally reacts with the gas, with the reaction products depositing on the growing boule as silicon carbide.

DESCRIPTION OF THE PREFERRED EMBODIMENT

Figure 1:
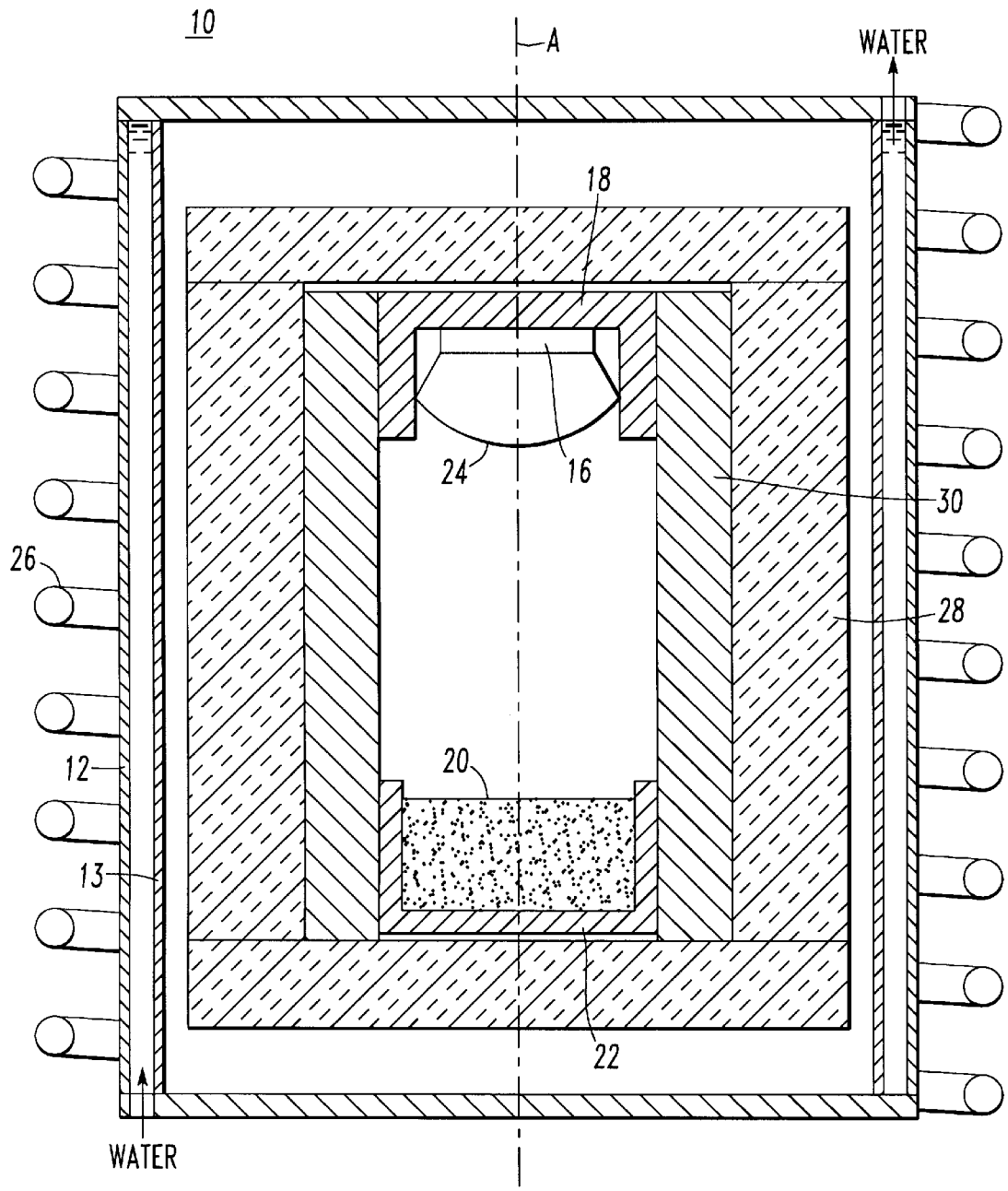
FIG. 1 shows, in rudimentary form, typical apparatus for growing silicon carbide boules by the physical vapor transport process.

In the drawings, which are not necessarily to scale, like or corresponding parts are denoted by like or corresponding reference numerals.

FIG. 1 shows, in rudimentary form, a typical apparatus for growing silicon carbide boules by the aforementioned physical vapor transport method. The apparatus includes a furnace system 10 having a vacuum tight enclosure formed by quartz cylinders 12 and 13, coaxially disposed about a central longitudinal axis A, with a cooling water flow between them. A silicon carbide seed crystal 16 is carried by seed holder 18 which is disposed at a certain distance from a silicon carbide feedstock 20, typically silicon carbide powder, within feedstock container 22. The required temperature for growth of the silicon carbide boule 24 is provided by a heating system such as an RF coil 26.

To grow the silicon carbide boule 24, the silicon carbide seed crystal 16 and silicon carbide feedstock 20 are placed in position surrounded by thermal insulation 28 and susceptor 30, and the furnace system is brought down to a near vacuum pressure of, for example, $10^{-7}$ Torr. The heater system 26 is then activated to drive off any adsorbed gases in order to reduce any electrically active impurities which may be present. The interior pressure is then increased to near atmospheric pressure and then reduced to operating pressure where the growth temperature is established.

During the growth process, if a boule in excess of about 2.5 cm is desired, the feedstock 20 becomes depleted to a point where it must be recharged. The apparatus is shut down, opened, and the feedstock charge is reloaded, after which temperature and pressure conditions are reestablished. This time consuming operation is repeated until the desired boule length is achieved.

The present invention allows for boule growth to extended lengths, without the requirement for repetitive disassembly and feedstock recharging.

In addition, the purity of the silicon carbide powder feedstock is not as high as semiconductor grade material (background impurities of $10^{17}$ cm$^{-3}$ vs $10^{14}$ cm$^{-3}$ required for high quality device fabrication) and very often the grown boule includes imperfections which would degrade proper semiconductor operation.

Figure 2:
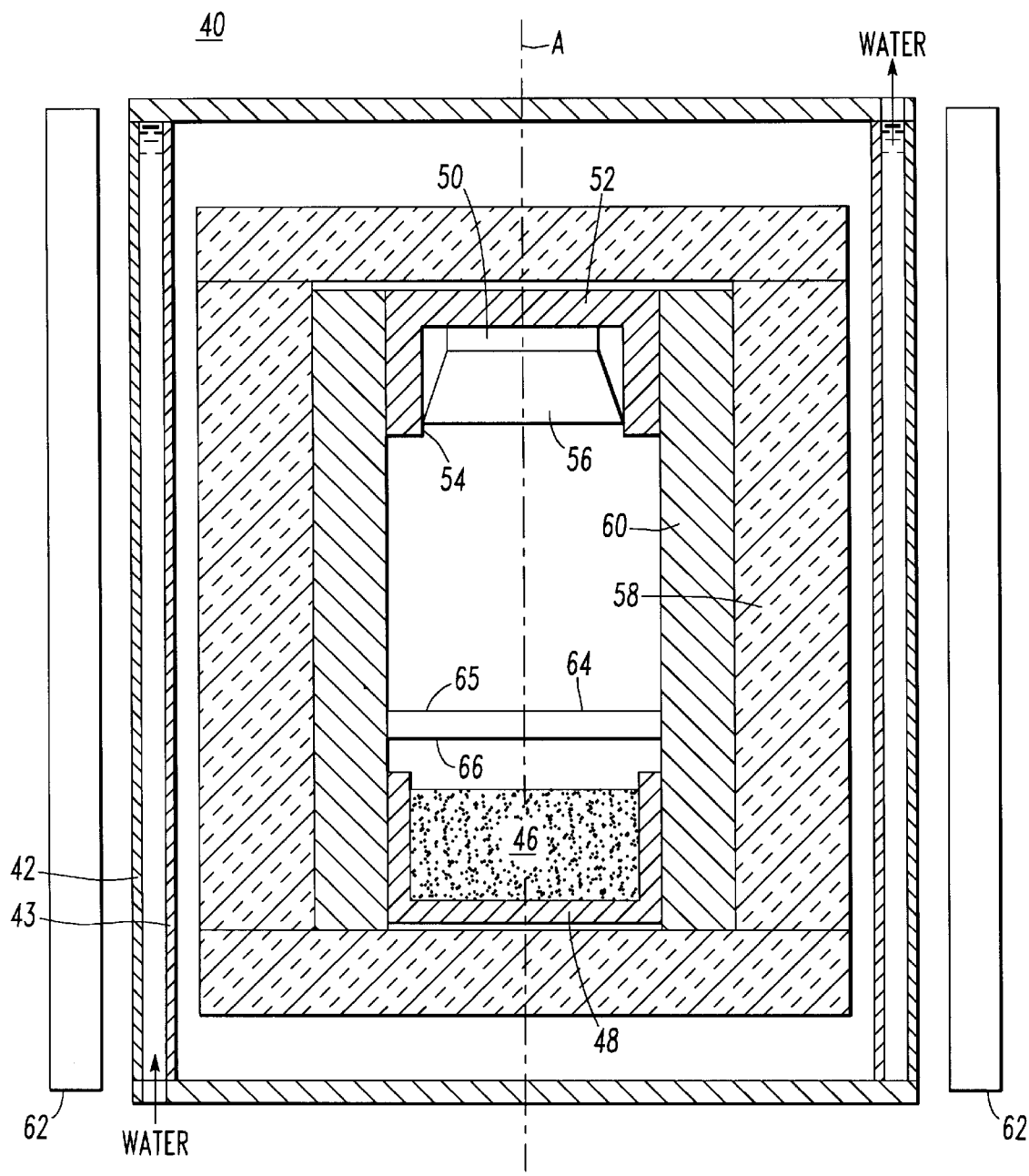
FIG. 2 illustrates one embodiment of the present invention.

FIG. 2 illustrates, by way of example, one embodiment of an improved physical vapor transport apparatus for growing semiconductor grade silicon carbide boules, although it is to be understood that the principles disclosed herein are also applicable to the growth of thin or thick epitaxial layers on a seed of silicon carbide, or other suitable material constituting a substrate member. In a manner similar to the prior art, the apparatus of the present invention includes a furnace system 40 having a vacuum tight enclosure surrounding longitudinal axis A and formed by coaxial quartz cylinders 42 and 43 with a cooling water flow between them.

Disposed at a first location within the furnace system 40 is a source of semiconductor grade silicon 46 having an ultra high purity in the order of $10^{11}$ to $10^{13}$ $cm^{-3}$ and contained within a quartz or graphite receptacle 48. Displaced from the silicon 46, at a second location within the furnace system 40 is a seed crystal 50, carried by a seed holder 52, the arrangement defining a growth cavity 54 for the growing of silicon carbide boule 56. Surrounding these components are thermal insulation 58 and susceptor 60. Although other materials may be applicable, the present invention will be described with respect to a seed crystal of silicon carbide.

A heating system 62 is provided to heat the silicon 46 to a predetermined temperature sufficient to melt and vaporize the silicon and to establish the appropriate temperature distribution for the promotion of crystal growth. Such heating system 62 may be constituted by one or more RF coils, by one or more resistance or other type heaters or by a combination thereof. In operation, after appropriate furnace degassing procedures, the requisite temperatures are established for crystal growth of the silicon carbide boule 56.

Figure 3:
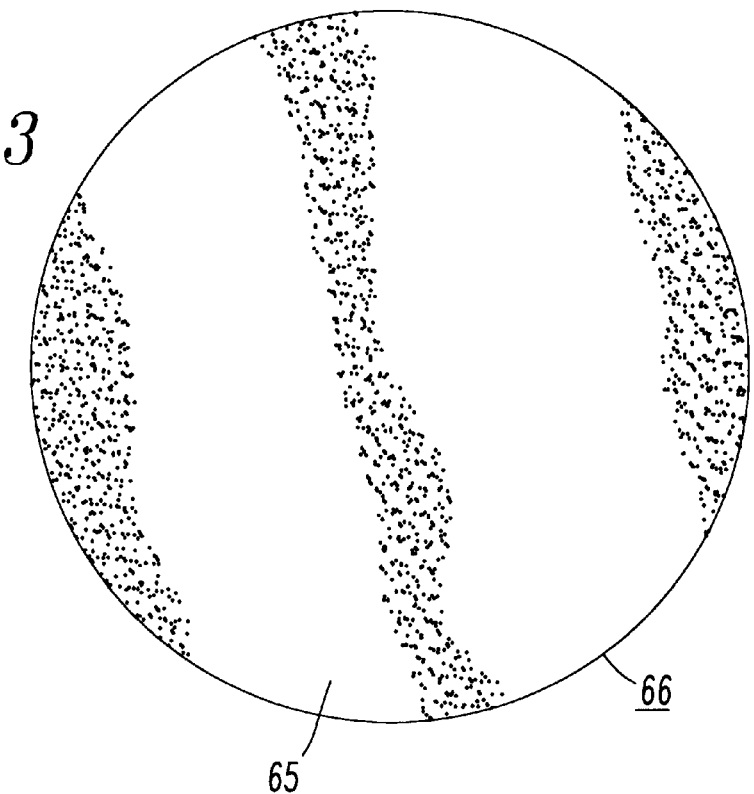
FIG. 3 is a plan view of the porous carbon disc illustrated in the apparatus of FIG. 2.

The improved apparatus for the embodiment of FIG. 2 includes a gas permeable, high purity carbon containing member disposed between the surface of the silicon 46 and seed crystal 50. This member functions not only to provide a source of carbon for reacting with the silicon vapor, but to also control the flux of the silicon vapor emanating from the surface of the silicon 46 when it is heated to elevated temperatures (where flux is the amount of silicon vapor passing through a given area in a given period of time). In one embodiment, the carbon containing member may be constituted such as by a porous carbon disc 64, also illustrated in plan view in FIG. 3, and having a high purity in the order of less than 5 ppm. The disc 64 includes a top surface 65 which faces the growth cavity 54 and a bottom surface 66 which faces the silicon 46.

The high purity semiconductor grade silicon 46 may be initially introduced into container, or receptacle 48, in the form of a solid single cylinder of silicon, as a powder or as individual silicon nuggets. Silicon has a melting point of about 1420° C. and accordingly, the temperature at the silicon location will be of a value not only to melt the silicon but to also vaporize it and provide for a large flux of silicon atoms, significantly greater than is possible with the prior art silicon carbide feedstock. For example, the silicon may be heated to a temperature within the range of 1420° C. to 2400° C. The temperatures and axial temperature profile within the furnace system 40 are adjusted to assure an appropriate flux of silicon and carbon constituents and deposition of silicon carbide on the seed 50.

As the silicon vapor emanating from the heated silicon 46 rises and diffuses through the porous carbon disc 64, there is a reaction with the carbon of the disc which forms various gaseous molecular species, the predominant ones of which include, silicon dicarbide ($SiC_2$), disilicon carbide ($Si_2C$) and silicon (Si). Silicon vapor as well as carbon vapor may also be generated. The gaseous molecular species condense on the growing crystal boule 56 resulting in the macroscopic growth of monocrystalline silicon carbide, thus elongating the boule 56 in the axial direction until the desired length is achieved.

As previously brought out, in the prior art physical vapor transport apparatus the feedstock is comprised of powdered silicon carbide. This limited charge can only supply so much silicon and carbon before it is used up. At the end of a limited growth run the feedstock container is left with a sintered mass of material consisting primarily of carbon. With the present invention however, virtually all of the silicon feedstock may be melted and vaporized during a single run thus eliminating the time consuming replenishment process required for silicon carbide and allowing for a greater size boule for the same volume initial charge as silicon carbide and at growth rates (e.g. 0.5 mm/hr) equal to or greater than conventional physical vapor transport systems.

Figure 4:
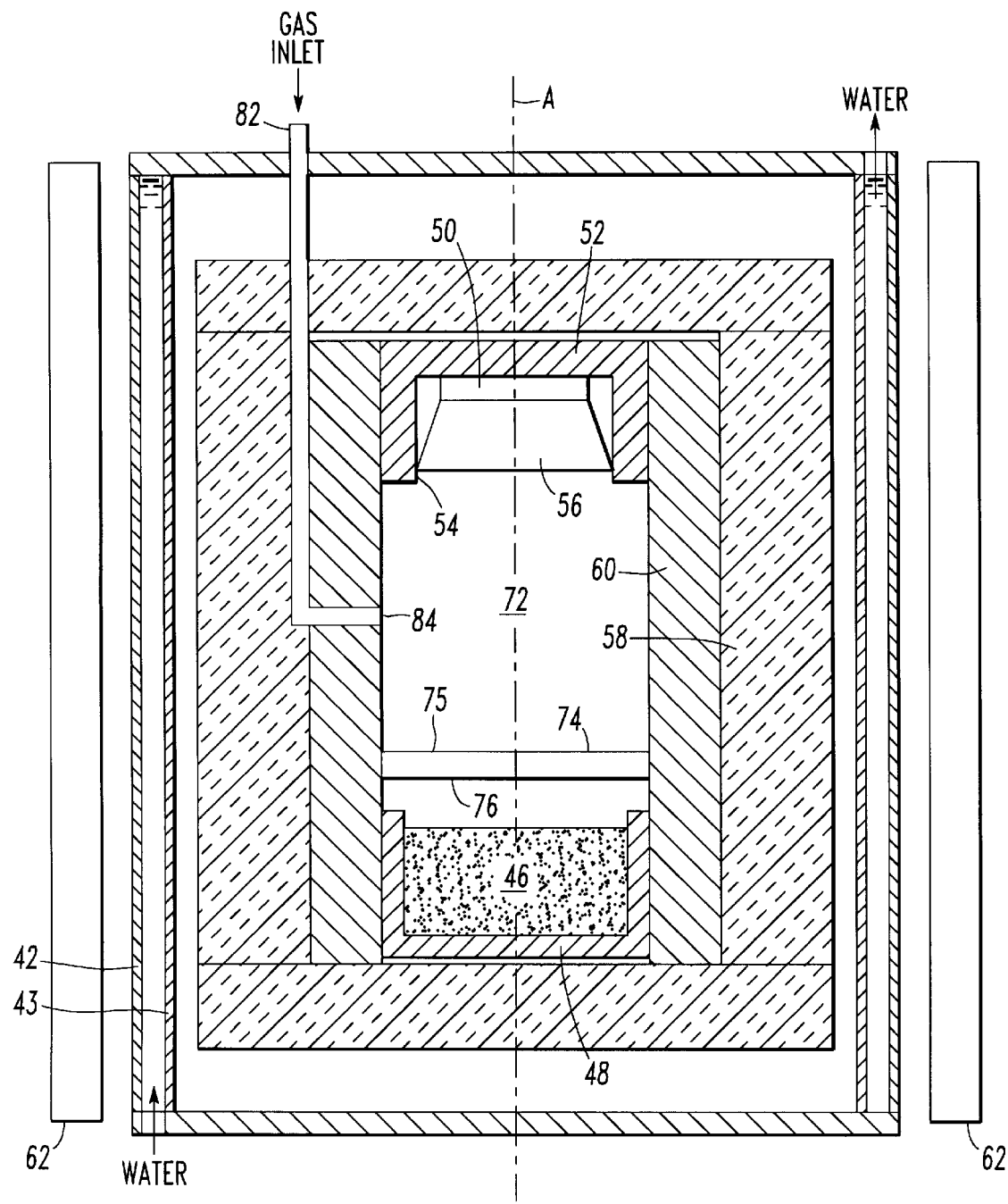
FIG. 4 illustrates another embodiment of the present invention.

FIG. 4 illustrates another embodiment of the invention which provides for even greater growth efficiency in terms of growth rate and effective source transport. In the arrangement of FIG. 4, one or more gasses is introduced into the furnace system, more particularly, into the susceptor 60. By way of example, the gases may be introduced into a reaction zone 72 located between a gas permeable barrier member 74, having top and bottom surfaces 75 and 76, and boule 56. Alternatively, or in addition, such gas or gases may be introduced between the silicon 46 and barrier member 74 or may even be introduced by bubbling through the liquid silicon. The category of gases which may be utilized include, either singly or in combination, an inert gas such as argon, a carrier gas such as hydrogen and a carbon-containing gas such as propane.

The gas introduction may be accomplished in a variety of ways one of which is by means of one or more high temperature gas conduits 82 which discharges the gas from one or more sources (not illustrated) into the reaction zone 72. This discharge is accomplished via one, or preferably, a plurality of passageways 84 extending through the susceptor 60. The concept of reacting a silicon vapor with a carbon-containing gas is more fully described and claimed in commonly owned copending application Ser. No. 08/987, 572, filed Dec. 11, 1997.

The carbon-containing gas is introduced into the reaction zone 72 (or elsewhere in the susceptor) at a temperature sufficient to decompose the gas into its hydrocarbon components. These react with the flux emanating from the barrier member 74 (or silicon 46), resulting in the further deposition of silicon carbide on growing boule 56. If hydrogen is utilized as a carrier gas it will facilitate the transport of carbon or carbon radicals which will be driven, by the temperature differential existing in the furnace, to the growing boule 56 where the carbon disassociates and reacts with available silicon to form silicon carbide.

With the arrangement of FIG. 4, the gas permeable barrier member 74 may be of a carbon material, however if carbon is supplied by other sources (such as a carbon-containing gas), member 74 may be constituted by other materials such as silicon carbide, silicon nitride, or tantalum carbide, by way of example. In such instance, the barrier member does not constitute a source of carbon but will still function to control silicon flux as well as to prevent any carbon gas which may be present in the reaction zone 72 from mixing with the melted silicon in container 48.

Figure 6:
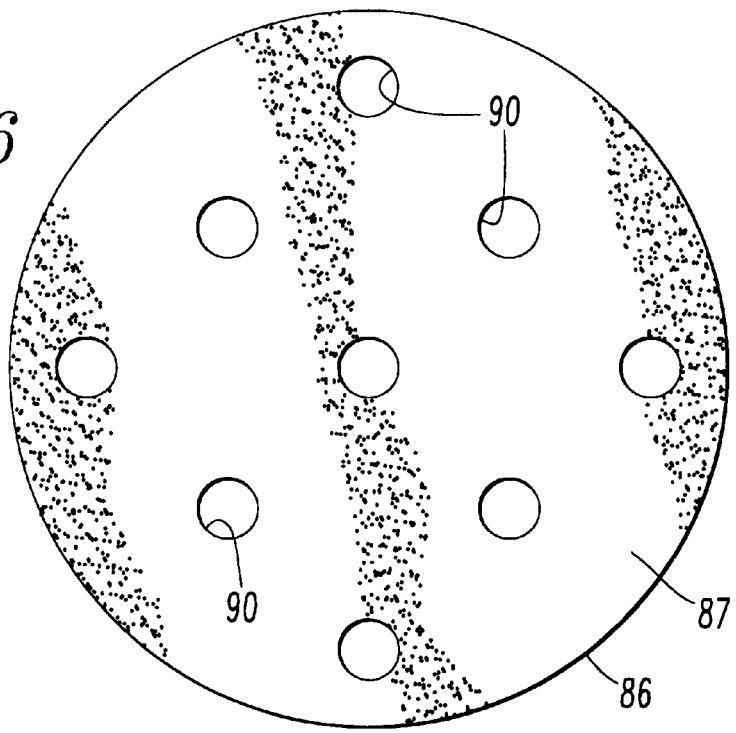
FIG. 6 is a plan view of the porous carbon disc illustrated in the apparatus of FIG. 5.
Figure 5:
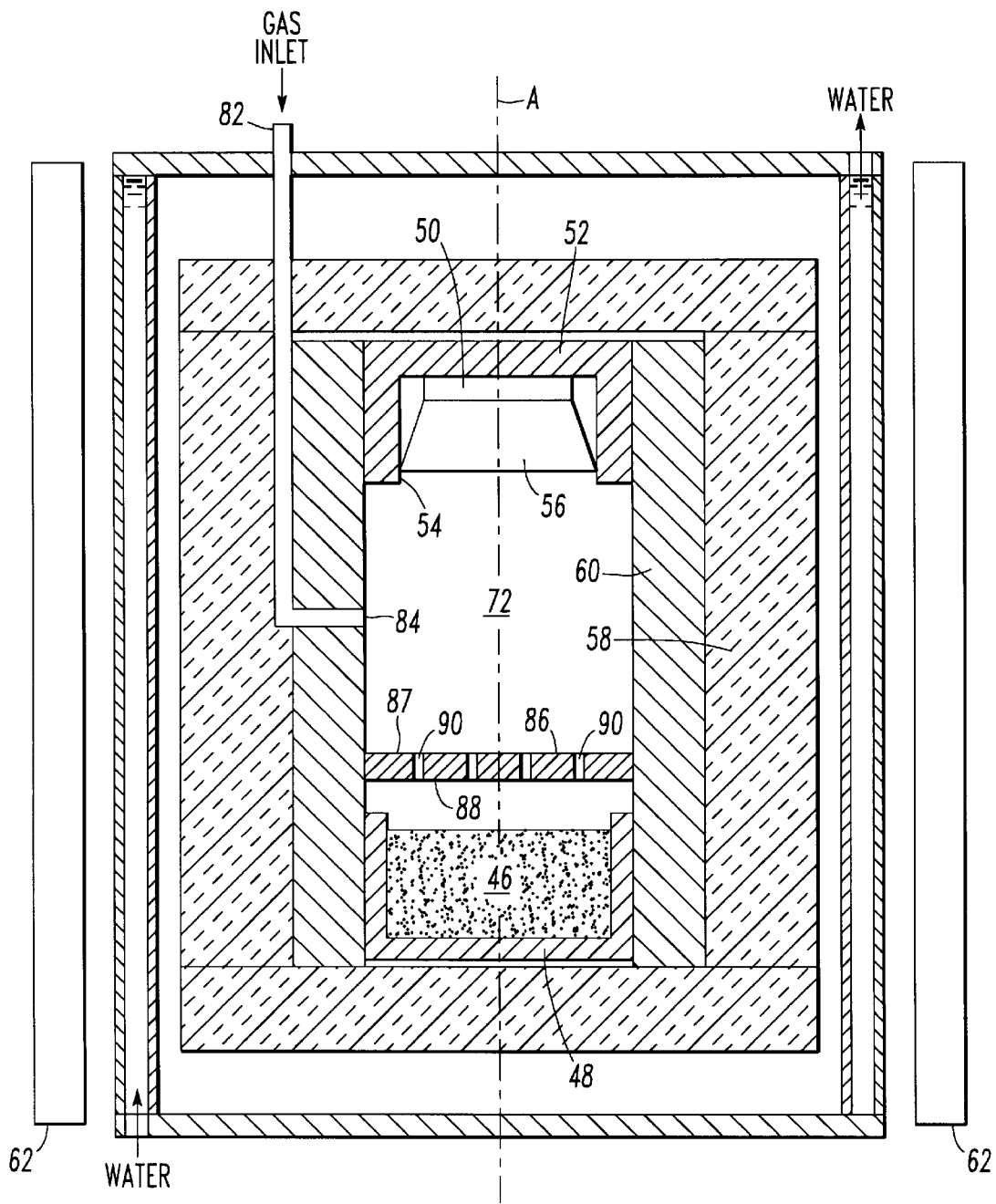
FIG. 5 illustrates the arrangement of FIG. 4, utilizing an alternative carbon disc.

FIG. 5 duplicates the arrangement of FIG. 4, however with a modified form of barrier member. More particularly, as illustrated in FIG. 5, as well as in the plan view in FIG. 6, let it be assumed that the barrier member is a porous carbon disc 86, having a top surface 87 and a bottom surface 88. The disc 86 includes a plurality of apertures 90 which extend from the top surface 87 to the bottom surface 88 and are illustrated by way of example to be axially aligned. Normally, the silicon vapor transport through the carbon disc is limited by the disc's porosity. With the disc 86, and the apertures 90 provided therein, the silicon vapor diffusion through the disc may be better regulated so as to facilitate the adjustment of the silicon-to-carbon ratio for superior stoichiometry control. Such apertures may also be incorporated into a non-porous carbon member, such as a high purity graphite, to control the silicon flux.

Although the present invention has been described with a certain degree of particularity, it is to be understood that various substitutions and modifications may be made without departing from the spirit and scope of the invention as defined in the appended claims.

What is claimed is:

1. Apparatus for growing high purity silicon carbide crystals, comprising:
   (A) a crystal growth furnace having a central longitudinal axis;
   (B) a source of high purity silicon at a first location within said furnace;
   (C) a seed crystal at a second location displaced from said first location, within said furnace;
   (D) a heating system operable to heat said silicon to a temperature sufficient to cause melting and vaporization of said silicon;
   (E) a gas permeable high purity porous carbon-containing member disposed between said source of high purity silicon and said seed crystal such that said vaporized silicon passes through said porous carbon-containing member and reacts therewith;
   (F) said heating system being operable to produce a temperature within said furnace system whereby products of the reaction of said vaporized silicon and said porous carbon-containing member are deposited as silicon carbide on said seed crystal and subsequent growth thereon.

2. Apparatus according to claim 1 wherein:
   (A) said seed crystal is a silicon carbide seed crystal.

3. Apparatus according to claim 1 wherein:
   (A) said high purity porous carbon-containing member is a in the form of a disc.

4. Apparatus for growing high purity silicon carbide crystals, comprising:
   (A) a crystal growth furnace having a central longitudinal axis;
   (B) a source of high purity silicon at a first location within said furnace;
   (C) a seed crystal at a second location displaced from said first location, within said furnace;
   (D) a heating system operable to heat said silicon to a temperature sufficient to cause melting and vaporization of said silicon;
   (E) a high purity porous carbon-containing member disposed between said source of high purity silicon and said seed crystal such that said vaporized silicon passes through said porous carbon-containing member;
   (F) means for introducing at least one gas into said furnace system, said gas being selected from the group consisting of an inert gas, a carrier gas and a carbon-containing gas;
   (G) said heating system being operable to produce a temperature distribution within said furnace system whereby products of any reaction of said vaporized silicon and a said gas are driven toward said seed crystal.

5. Apparatus according to claim 4 wherein:
   (A) said at least one gas is a carbon-containing gas.

6. Apparatus according to claim 4 wherein:
   (A) said carbon-containing gas is propane.

7. Apparatus according to claim 4 wherein:
   (A) said at least one gas is a carrier gas.

8. Apparatus according to claim 7 wherein:
   (A) said carrier gas is hydrogen.

9. Apparatus according to claim 4 wherein;
   (A) said porous carbon-containing member includes a top surface and a bottom surface; and which additionally includes
   (B) a plurality of apertures which extend from said top surface to said bottom surface of said porous carbon-containing member.

10. Apparatus according to claim 4 wherein:
    (A) said apertures are axially aligned.

\* \* \* \* \*